(12) United States Patent
Dohata et al.

(10) Patent No.: US 9,664,756 B2
(45) Date of Patent: May 30, 2017

(54) MAGNETIC RESONANCE IMAGING DEVICE AND RF COIL

(71) Applicant: Hitachi, Ltd., Tokyo (JP)

(72) Inventors: Masayoshi Dohata, Tokyo (JP); Yoshihisa Soutome, Tokyo (JP)

(73) Assignee: HITACHI, LTD., Tokyo (JP)

( * ) Notice: Subject to any disclaimer, the term of this patent is extended or adjusted under 35 U.S.C. 154(b) by 400 days.

(21) Appl. No.: 14/379,526

(22) PCT Filed: Dec. 20, 2012

(86) PCT No.: PCT/JP2012/083053
§ 371 (c)(1),
(2) Date: Aug. 19, 2014

(87) PCT Pub. No.: WO2013/125144
PCT Pub. Date: Aug. 29, 2013

(65) Prior Publication Data
US 2015/0028873 A1 Jan. 29, 2015

(30) Foreign Application Priority Data
Feb. 22, 2012 (JP) .................................. 2012-035766

(51) Int. Cl.
*G01R 33/34* (2006.01)
*G01R 33/48* (2006.01)
(Continued)

(52) U.S. Cl.
CPC ... *G01R 33/34092* (2013.01); *G01R 33/3415* (2013.01); *G01R 33/385* (2013.01);
(Continued)

(58) Field of Classification Search
CPC G01R 33/34092; G01R 33/48; G01R 33/385; G01R 33/3415; G01R 33/34007; G01R 33/3621; G01R 33/3657
See application file for complete search history.

(56) References Cited

U.S. PATENT DOCUMENTS 5,065,760 A * 11/1991 Krause ............... A61B 5/04286
324/318
7,365,542 B1 * 4/2008 Rohling ........... G01R 33/34084
324/318

(Continued)

FOREIGN PATENT DOCUMENTS

JP 2006-14823 A 1/2006
JP 2008-132308 A 6/2008

(Continued)

*Primary Examiner* — G. M. Hyder
(74) *Attorney, Agent, or Firm* — Baker Botts L.L.P.

(57) ABSTRACT

A lower cost MRI device with a portable table detachable from the gantry is provided along with a lower cost table equipped with an easy-to-use and easy-to-install RF coil system able to perform high-resolution head and neck imaging and high-speed whole body imaging in both head-first and feet-first modes. This magnetic resonance imaging device has a portable table detachable from the gantry, and the portable table has a docking connector that can be connected to the gantry and a ceiling panel on which an RF coil can be installed to receive nuclear magnetic resonance signals generated by the examinee and to irradiate the examinee with a high-frequency magnetic field. The RF coil is divided into two or more RF coil units, the ceiling panel has a plurality of ceiling panel connectors enabling each RF coil unit to be connected, and each RF coil unit has a connector. Each RF coil unit is arranged in overlapping fashion on the ceiling plate and the ceiling panel connectors and coil connectors are connected without having to establish an electrical connection between RF coil units.

7 Claims, 13 Drawing Sheets

(51) Int. Cl.
*G01R 33/3415* (2006.01)
*G01R 33/385* (2006.01)
*G01R 33/36* (2006.01)

(52) U.S. Cl.
CPC ........ *G01R 33/48* (2013.01); *G01R 33/34007* (2013.01); *G01R 33/3621* (2013.01); *G01R 33/3657* (2013.01)

(56) References Cited

U.S. PATENT DOCUMENTS

| | | |
|---|---|---|
| 2008/0100297 A1 | 5/2008 | Ishii et al. |
| 2008/0211498 A1 | 9/2008 | Dannels et al. |
| 2011/0031970 A1 | 2/2011 | Ninomiya et al. |

FOREIGN PATENT DOCUMENTS

| | | |
|---|---|---|
| JP | 2008-161404 A | 7/2008 |
| JP | 2009-539502 A | 11/2009 |

\* cited by examiner

FIG. 2
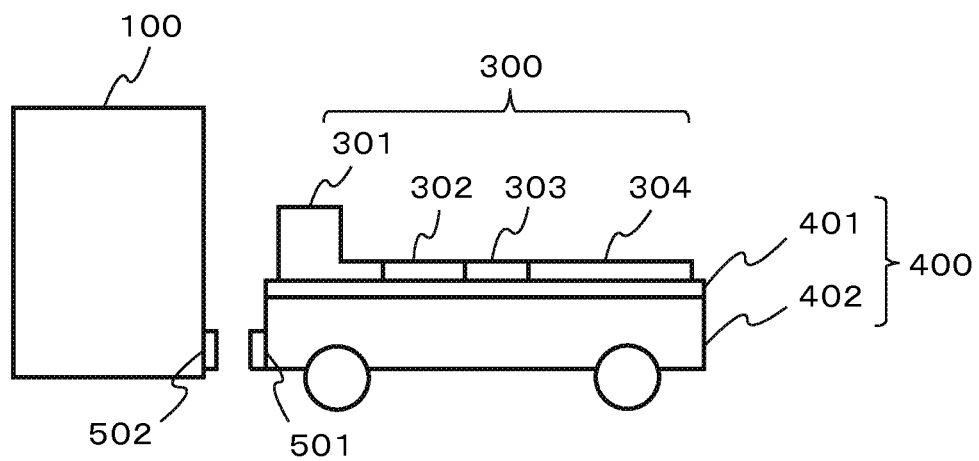
DIAGRAM SHOWING IMAGING DEVICE FOR HEAD FIRST
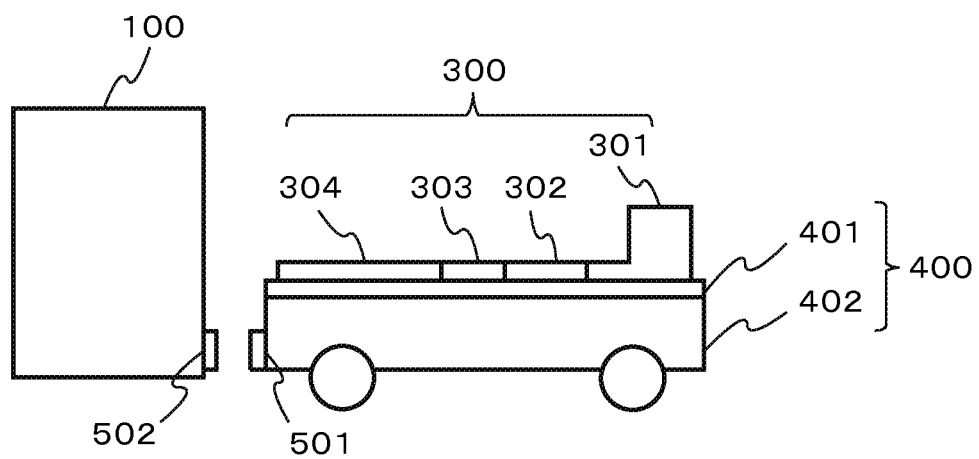
DIAGRAM SHOWING IMAGING DEVICE FOR FEET FIRST

FIG. 5
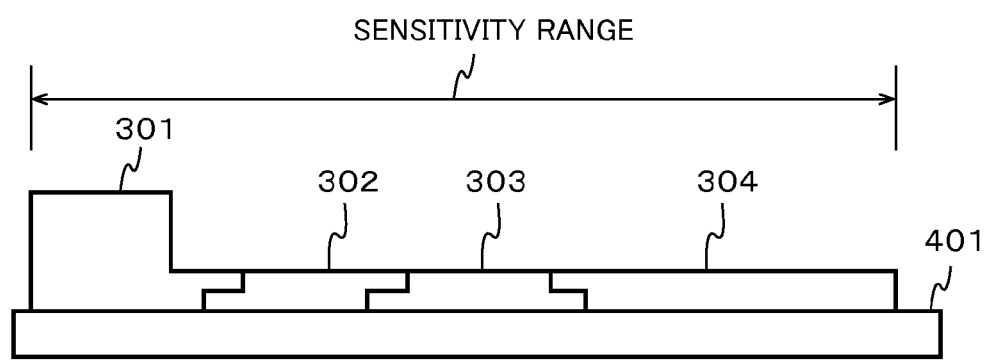
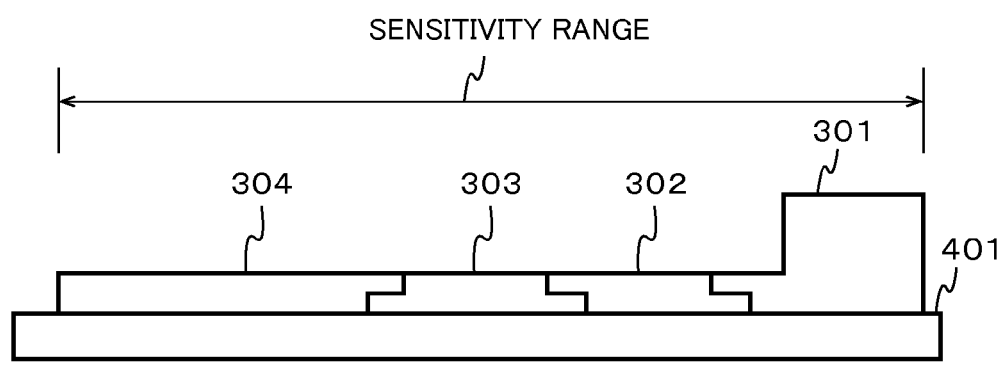

FIG. 6
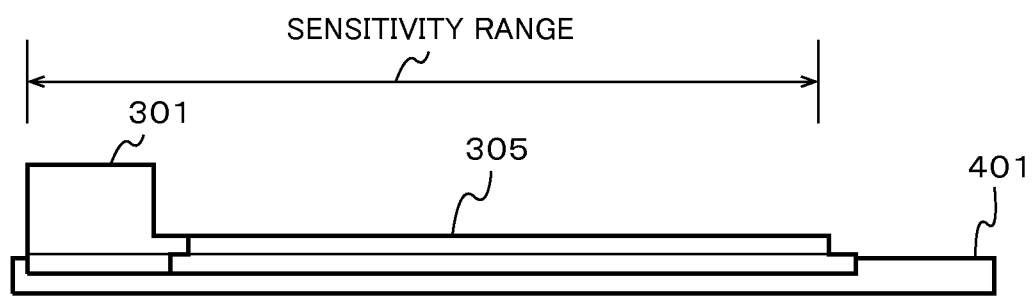
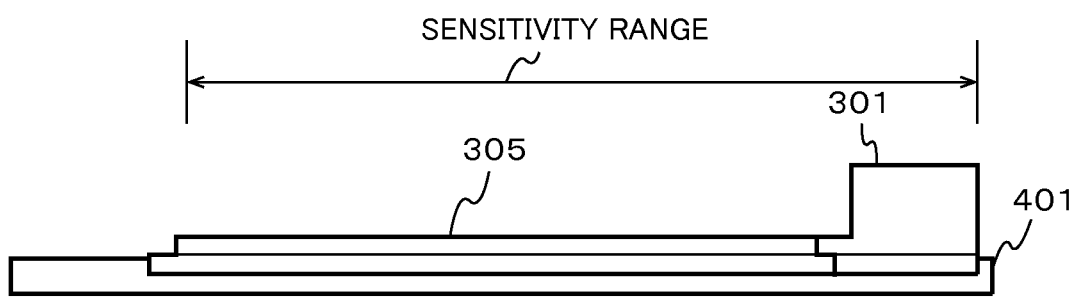

FIG. 8
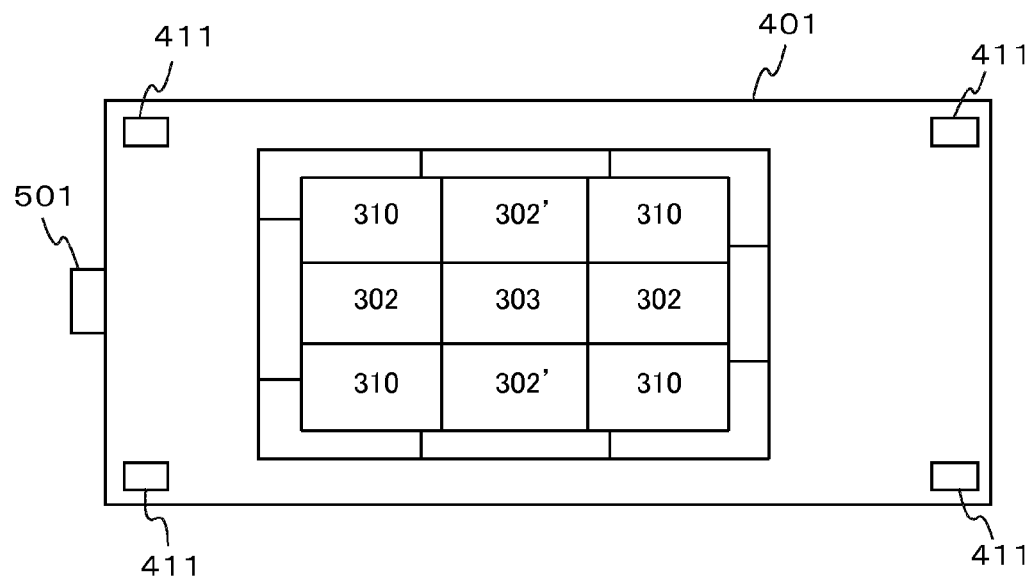
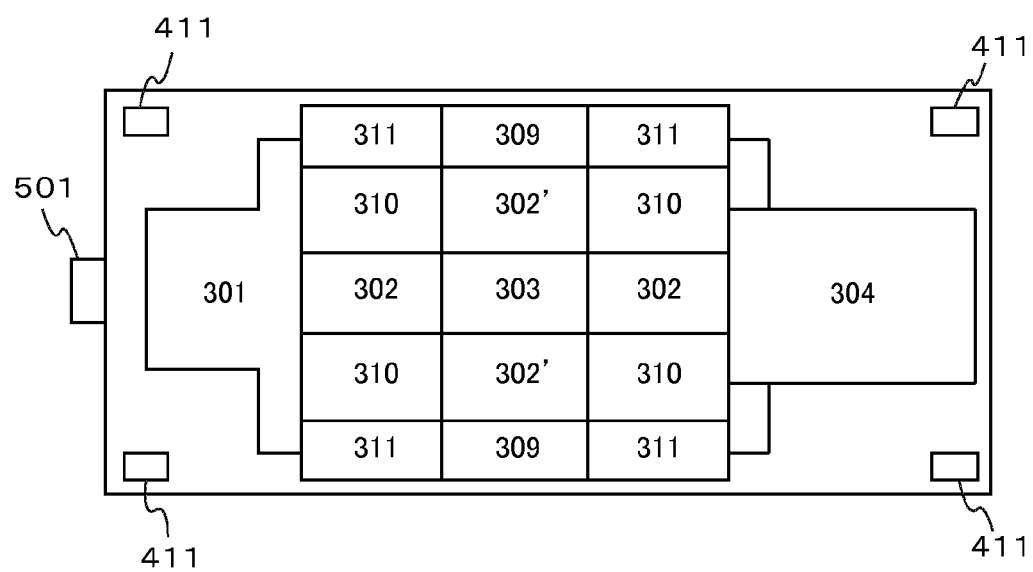

FIG. 10
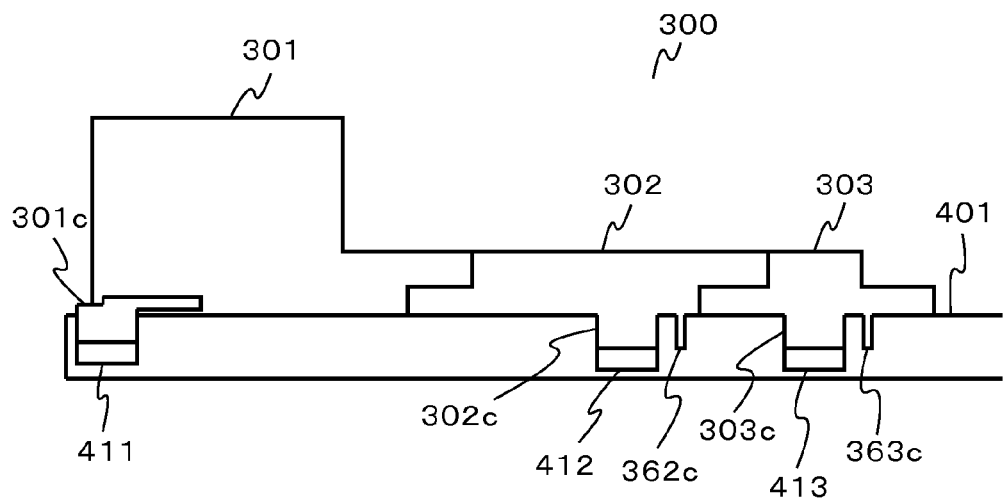
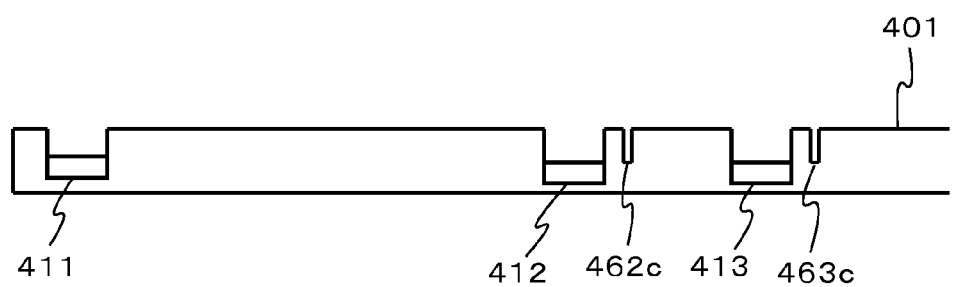
401 SIDE SIDE CROSS-SECTIONAL VIEW
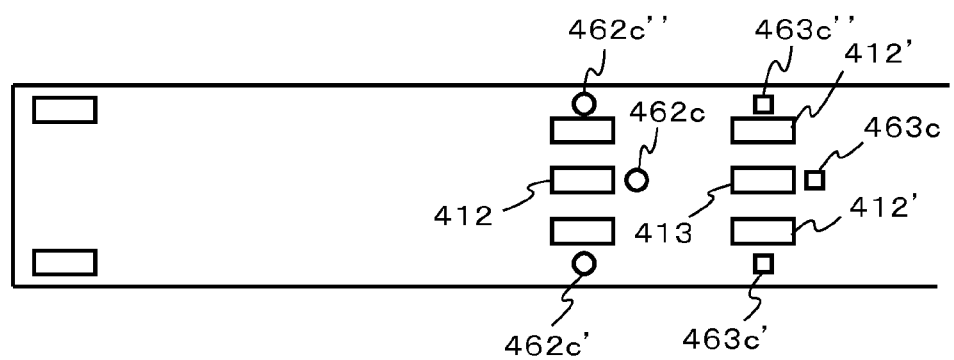
401 TOP VIEW

MAGNETIC RESONANCE IMAGING DEVICE AND RF COIL

TECHNICAL FIELD

The present invention relates to a magnetic resonance imaging device (MRI device), and relates to a radiofrequency coil (RF coil) used on a portable table.

BACKGROUND ART

An MRI device is a device which arranges a subject in a uniform static magnetic field space in a shield room, applies a gradient magnetic field and an exciting high frequency magnetic field, receives a magnetic resonance signal generated by using nuclear magnetic resonance with a high frequency coil (RF reception coil), and images an object to be examined. A range in which simultaneous imaging can be performed is limited to the static magnetic field space at maximum, and a range from which a high image quality can be obtained is limited to a sensitivity range of the RF reception coil.

The performances demanded for the RF reception coil include an S/N ratio which determines whether image quality is good or not, the sensitivity range which determines a field of view of an image, and a parallel imaging performance required for higher-speed imaging. The parallel imaging is a method in which a reception coil formed by a plurality of coil elements is used and simultaneous signal measurement is performed, so that an imaging time is reduced. A plurality of rectangular or circular loop coil elements are arranged in a certain direction (a body width direction or a body axis direction), and a phase encoding direction is selected in that direction. The parallel imaging is a technique which can reduce the imaging time to 1/(the number of the coil elements arranged in the phase encoding direction) if the arrangement of the coil elements is the most appropriate. Moreover, by arranging a plurality of loop coil elements two-dimensionally (for example, in the body width direction and in the body axis direction), a reception coil can be realized which can perform higher-speed imaging and has the sensitivity area in a wide range such as the whole body.

The RF reception coil which receives a nuclear magnetic resonance signal can be applied as an RF transmission coil, when an amplifier with a low-output impedance is connected instead of an amplifier for signal detection and amplification with a low-input impedance. Moreover, when a transmission/reception switching circuit is used between the reception amplifier, the transmission amplifier, and the coil, the coil can be used as a coil which can perform both transmission and reception. In the following description, the RF reception coil is described as an RF coil because it can be used not only for reception but also for transmission.

In a case where the wide range such as the whole body is an object to be examined, a technique for imaging the whole body by moving a table table top is used. In this case, seamless imaging can be performed by using a plurality of loop coil elements arranged two dimensionally as described before as an RF coil having a wide sensitivity range. As the RF coil having the wide sensitivity range, an integrated RF coil unit permanently installed on the table top or incorporated in the table top is known. In such an integrated RF coil unit, a plurality of coil elements forming one or more channels are arranged in one housing case in the most appropriate manner to minimize electromagnetic coupling, and a required element is selected, switched, and used.

However, since the integrated RF coil is heavy, there is a problem that a lot of labor is required for detachment. Therefore, in Japanese Patent Application Laid-Open No. 2006-14823 (Patent Literature 1), the coil is taken apart, so that the size and the weight thereof are reduced and the coil can be easily moved from a stand to a place for the coil. More specifically, Patent Literature 1 discloses an RF coil used for receiving a high frequency wave. The RF coil includes a plurality of coil units two or more of which are connected along a predetermined direction and which can be detached. Each of the coil units includes at least one type of first coil element having a shape corresponding to various types of imaged regions, defining one channel, and receiving a high frequency wave from the various types of imaged regions; a portion of at least one type of second coil element having a shape corresponding various types of imaged regions, defining one channel, and, when another coil unit is connected to that coil unit, forming the second coil element for receiving a high frequency wave from the various types of imaged regions together with a remaining portion of the second coil element included in the other coil unit; and a joint portion for joining that coil unit along the predetermined direction. Especially, Patent Literature 1 is characteristic in that the coil units are arranged to be connected in straight portions thereof for making the structure of a connection member of the coil units as simple as possible.

CITATION LIST

Patent Literature

PTL 1: Japanese Patent Application Laid-Open No. 2006-14823

SUMMARY OF INVENTION

Technical Problem

In the MRI device, it is necessary that a subject has to be placed in a narrow tunnel bore for a long time. Therefore, a subject having claustrophobia cannot enter therein or a subject may feel fear while the subject placed on a table top is moved into the bore from the head side (Head-First mode) in some cases. For relieving the feeling of fear, a treatment in which the table top is moved such that the subject enters into the bore from the foot side (Feet-First mode) may be performed. Therefore, it is desirable the both Head-First mode imaging and Feet-First mode imaging can be performed.

As a method for enabling both Head-First mode imaging and Feet-First mode imaging by using an integrated RF coil permanently installed on the table top, which is integrated with the portable table, or an RF coil incorporated in the table top, it is necessary to slide the coil position or change the orientation of the coil. However, there is a problem of a large worker's burden because the coil is large in size and heavy.

As a technique for overcoming the heavy weight, a technique of dividing the RF coil in Patent Literature 1 is effective. However, the RF coil disclosed in Patent Literature 1, in which a plurality of detachable coil units are provided and are jointed to one another at joint portions, needs an operation for joining the joint portions to one another in addition to an operation for placing the coil when the RF coil is installed. Thus, there is a problem of operability.

It is an object of the present invention to provide a table provided with an RF coil system which enables high-resolution imaging of a head and a neck and high-speed imaging of a whole body both in Head-First mode and Feet-First mode in an MRI device having a portable table which can be attached to and detached from a gantry, and which is good in installability and operability, and an MRI device having that table at a relatively low cost.

Solution to Problem

As an aspect for solving the above problems, the present invention provides a magnetic resonance imaging device in which an RF coil thereof includes: a plurality of coil elements which receive a high frequency signal from a subject on different channels, respectively; feed points connected to the coil elements to detect the high frequency signal received by the coil elements, respectively; and a plurality of housings accommodating the coil elements and the feed points, the RF coil is divided into a plurality of units each including the coil element, the feed point, and the housing by dividing portions of the housings, coil elements of adjacent units overlap each other at least partly, and the dividing portion of the housing is provided between the coil elements of the adjacent units.

Advantageous Effects of Invention

The present invention realizes a portable table which can be attached to and detached from a gantry, enables high-resolution imaging of a head and a neck and high-speed imaging of a whole body both in Head-First mode and Feet-First mode, and is provided with an RF coil system with good installability and operability, and an MRI device including that portable table at relatively low cost.

BRIEF DESCRIPTION OF DRAWINGS

FIG. 2 shows a first example of the present invention, and shows a portable table and an RF coil installed thereon in a case of Head First mode and a case of Feet First mode.

FIG. 5 is an appearance view of the portable table and four types of RF coil units installed thereon in the first example of the present invention, when seen from the side.

FIG. 6 is an appearance view of a table top of a portable table and RF coil units installed thereon or therein in a conventional technique.

FIG. 8 shows a third example of the present invention, and is a diagram showing a portable table and an exemplary arrangement of RF coil units installed on a table top of the portable table.

FIG. 10 is a cross-sectional view showing a connector in the table top of the portable table, a connector of the RF coil unit installed thereon, and a mechanism for coil identification according to the present invention, when seen from the side.

DESCRIPTION OF EMBODIMENTS

Embodiments of the present invention will be described below, referring to FIGS. 1 to 13. In the following description, components having the same functions and structures are labeled with the same reference signs and redundant description is omitted.

Example 1

The best mode of the present invention is described below as a first example of the present invention, referring to FIGS. 1 to 6 and FIG. 13.

Figure 1:
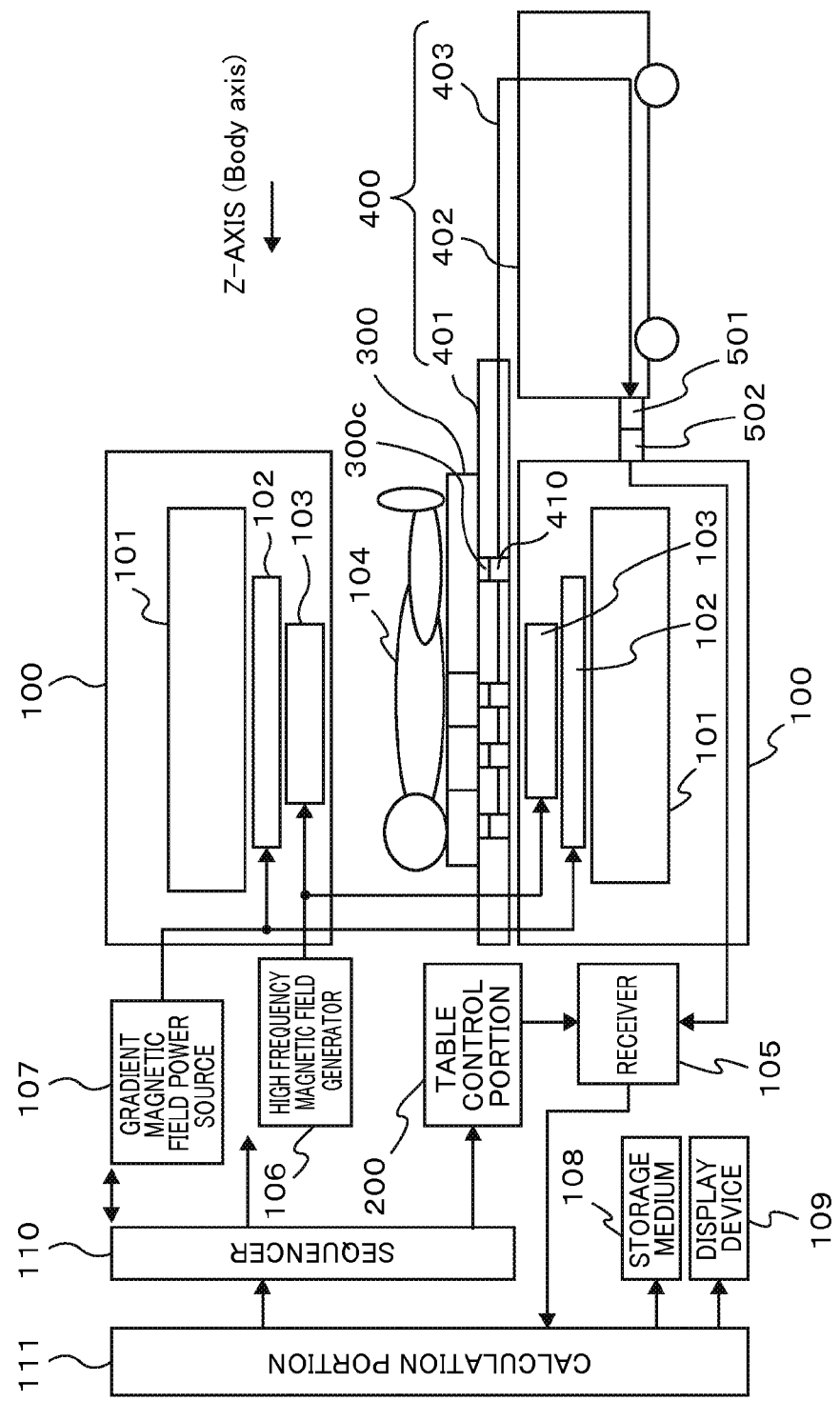
FIG. 1 is an exemplary structure diagram of an MRI device according to the present invention.

FIG. 1 is a diagram showing an entire magnetic resonance imaging device of the present invention, and is an exemplary structure diagram of an MRI device having a portable table 400 which can be attached to and detached from a gantry 100. As shown in FIG. 1, the gantry 100 of the MRI device in the present invention includes a magnet 101 which generates a static magnetic field, a gradient magnetic field generation coil 102 which generates a gradient magnetic field, and a high frequency transmitter coil 103 which generates a high frequency magnetic field.

The portable table 400 which can be attached to and detached from the gantry 100 by docking connectors 501 and 502 includes a table top 401 which can move in z-axis direction on a frame 402, and wired composite cable wiring 403. On or in the table top 401, an RF coil 300 is provided. A subject 104 is placed on the RF coil 300, and is arranged in the magnet 101 and the gradient magnetic field generation coil 102 by movement of the table top in z-axis direction. The RF coil 300 is provided with a coil connector 300c. The coil connector 300c is connected to a table top connector 410 connected to a composite cable in the table top 401, when the RF coil is placed.

In general, the gradient magnetic field generation coil 102 is formed by three-axis gradient magnetic field coils of which three axes are perpendicular to one another. Moreover, a sequencer 110 sends a command to a gradient magnetic field power source 107 and a high frequency magnetic field generator 106 to generate a gradient magnetic field and an RF pulse from the gradient magnetic field coil 102 and the high frequency transmitter coil 103, respectively. The high frequency magnetic field generator 106 is usually formed by an RF pulse generator and a power amplifier which amplifies the RF pulse. The amplified RF pulse output is applied to the subject 104 via the high frequency transmitter coil 103 at a timing in accordance with the command from the sequencer 110.

The gradient magnetic field power source 107 also applies a gradient magnetic field to the subject 104 from the respective three-axis gradient magnetic field coils at a timing in accordance with the command from the sequencer 110. A magnetic resonance signal generated from the subject 104 is received by the RF coil 300, is amplified in a preamplifier (not shown here) in the RF coil, and is then transmitted to a receiver 105 via the coil connector 300c, the table top connector 410, the cable wiring 403, and the docking connectors 501 and 502. In the receiver 105, appropriate signal processing is performed, A/D conversion (sampling) is performed, and then signal detection is performed. The detected signal is sent to a calculation portion 111, and is subjected to sampling processing there. Then, digital signal processing such as image reconstruction is performed and the result is displayed on a display portion 109.

Digital data or a measurement condition can be stored in a storage medium 108 as needed. The sequencer 110 performs controls in accordance with the measurement condition stored in the storage medium 108 and/or a command received from the calculation portion 111 so that respective devices operate at programmed timings with programmed intensities. Among the programs, those that describe timings of application of the RF pulse, application of the gradient magnetic field, and reception of a nuclear magnetic resonance signal and intensities of the RF pulse and the gradient magnetic field are especially referred to as an imaging sequence.

Figure 13:
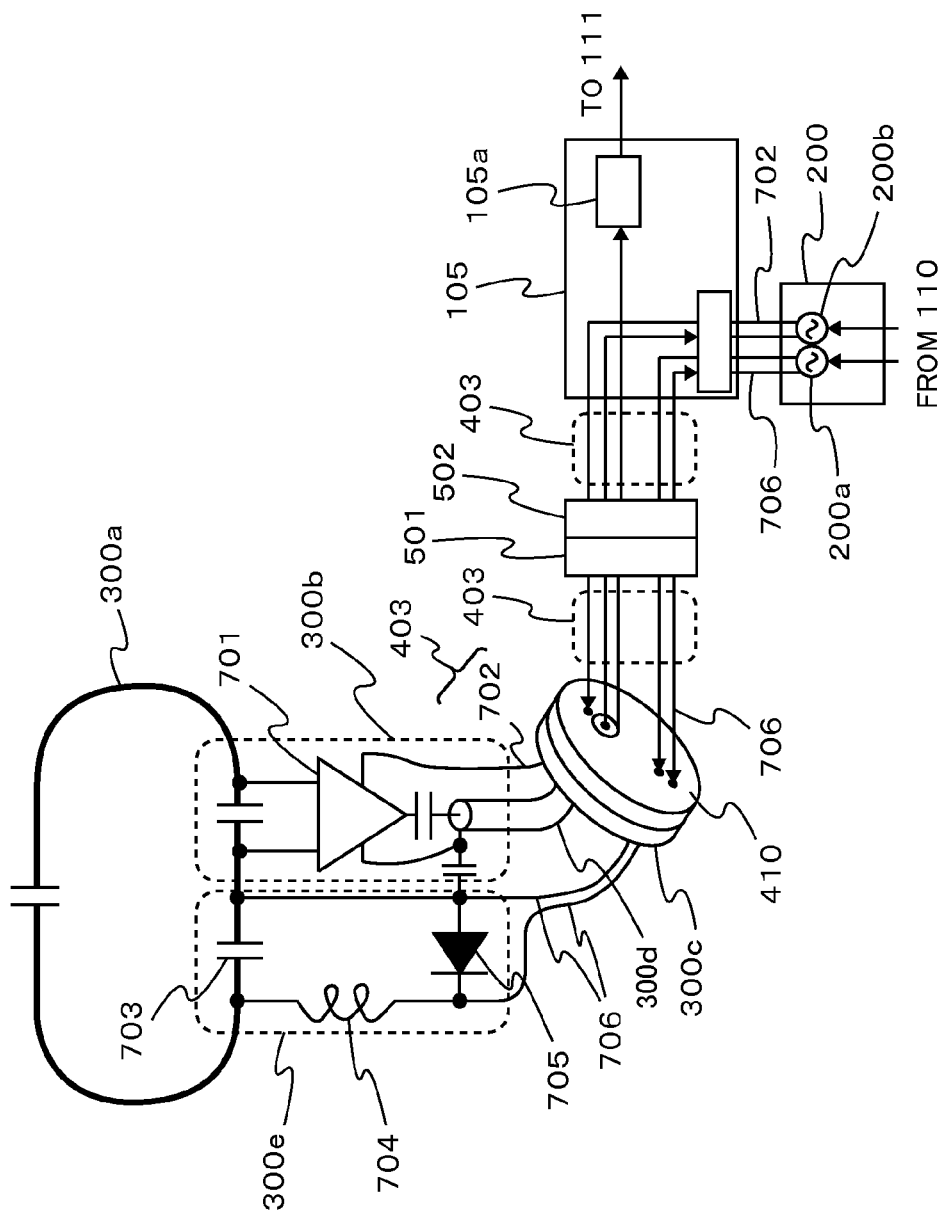
FIG. 13 is a diagram showing one of a plurality of elements in the RF coil unit and a signal detection portion and a trap circuit therefore.

A circuit in the RF coil 300 controlled by the imaging sequence is described by using FIG. 13. FIG. 13 illustrates only one of a plurality of channels, and shows a coil element 300a provided in the RF coil (used as a reception coil here), a signal detection portion 300b, a trap circuit 300e, a reception cable 300d, the coil connector 300c, the table top connector 410 and the docking connector 501 provided in the table top 401, the docking connector 502 provided in the gantry 100, the receiver 105, and an A/D signal processor 105a which is in charge of one channel among A/D signal processors respectively provided for a plurality of channels in the receiver 105.

In the signal detection portion 300b, a matching circuit and a preamplifier 701 are provided, and a power supply cable 702 for receiving power supply is connected to the preamplifier 701. The trap circuit 300e is formed by a capacitor 703, an inductor 704, and a diode 705. At both ends of the diode 705, a current supply cable 706 for supplying a diode driving current is connected. On the other hand, a table top control portion 200 has functions of controlling movement of the table top of the portable table and identifying the type of the coil connected to the table top, and is also provided with a current supply source 200a and a preamplifier driving power source 200b.

The current supply source 200a and the preamplifier driving power source 200b are connected to the current supply cable 706 and the power supply cable 702, respectively, and, as needed, are assembled into one cable together with the reception cable 300d via a relay board within the receiver 105 such that that cable is connected as the composite cable wiring 403 to the diode 705 and the preamplifier 701 via the coil connector 300c, the table top connector 410, and the docking connectors 501 and 502. The preamplifier 701 operates by the preamplifier driving power source 200b and receives a nuclear magnetic resonance signal in accordance with the reception timing of the imaging sequence.

The reception cable 300d amplifies the nuclear magnetic resonance signal received by the coil element 300a with the preamplifier 701 in the signal detection portion 300b and transmits it to the A/D signal processor 105a via the coil connector 300c, the table top connector 410, and the docking connectors 501 and 502. In the trap circuit 300e, the diode 705 is driven by the current supply source 200a such that, when the diode is turned ON, a resonance circuit formed by the capacitor 701 and the inductor 704 resonates in series, the impedance seen from both ends of the capacitor 703 toward the coil element 300a side becomes large, and the resonance frequency of the coil element 300a largely shifts from the resonance frequency of the nuclear magnetic resonance signal.

On the other hand, when the diode is turned OFF, the trap circuit is not established and the resonance frequency of the coil element 300a is coincident with that of the nuclear magnetic resonance signal, so that the coil element 300a operates as the RF coil. With the above-described structure, the table top control portion 200 controls the current supply source 200a and the preamplifier driving power source 200b in accordance with the command from the sequencer 110. Especially in a case where the RF coil 300 is used as the reception coil, the table top control portion 200 controls turning ON and OFF of the diode 705 in the trap circuit 300c in synchronization with the application timing of the RF pulse and the reception timing of the nuclear magnetic resonance signal that are in accordance with the imaging sequence for preventing electromagnetic coupling with the transmitter coil 103.

For turning an operation for receiving a nuclear magnetic resonance signal from a coil element located outside a desired imaging range OFF, the power source 200a for the diode 705 in the trap circuit 300c may be turned ON or the preamplifier power source 200b may be turned OFF. Although only a case where the RF coil 300 is the reception coil is described here, in a case where the RF coil 300 is an irradiation coil, this can be applied to the irradiation coil when a transmission/reception switching circuit is inserted between the signal detection portion 300b and 300a, the current supply cable 706 is connected to the transmission/reception switching circuit, and the table top control portion 200 controls the transmission/reception switching circuit. In this case, the trap circuit 300e is not required.

FIG. 2 are appearance views of the MRI device having the portable table 400 which can be attached to and detached from the gantry 100, one of which is a view showing coil installation in a case of Head First mode where the table top 401 moves such that a subject (not shown) enters into the gantry 100 from the head side, and the other of which is a view showing coil installation in a case of Feet First mode where the table top 401 moves such that a subject (not shown) enters into the gantry 100 from the feet side.

The portable table 400 and the gantry 100 are attached to and detached from each other by connection and separation of the docking connectors 501 and 502. Considering the attachability/detachability and the material cost of the portable table 400 and a wiring process of the cable wiring 403 within the table, it is desirable that the docking connector 501 be provided at only one position on a certain surface of the table top 401 or the frame 402.

Therefore, in the RF coil 300, each of two or more RF coil units (divided into a first RF coil unit 301, a second RF coil unit 302, a third RF coil unit 303, and a fourth RF coil unit 304 here) has an independent coil connector (not shown here), is connected to the table top connector (not shown here) on the table top 401, and is placed on the table top 401. Please note that the first RF coil unit 301 is an RF coil unit having sensitivity at the head portion of the subject. In a case of Head First mode, the first RF coil unit 301 is arranged on the table top 401 on the side closer to the gantry 100. In a case of Feet First mode, the first RF coil unit 301 is arranged on the table top 401 on the side farther from the gantry 100. Thus, it is possible to provide the docking connector 501 provided in the portable table, at only one position on a certain surface of the table top 401 or the frame 402.

Figure 3:
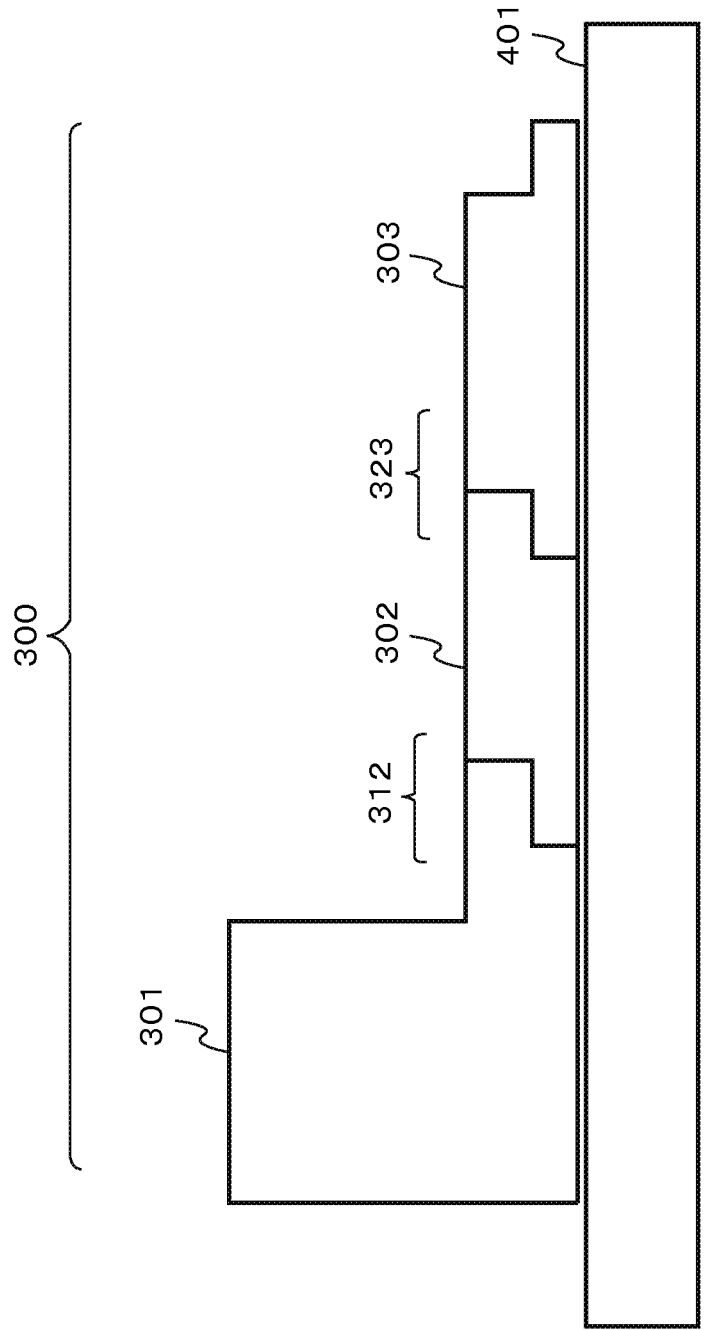
FIG. 3 shows the first example of the present invention, and is an appearance view of the portable table and an overlapped portion of RF coil units installed on a table top of the portable table, when seen from the side.

FIG. 3 is a diagram showing the RF coil 300 and the table top 401 of the present invention. FIG. 3 is a side view in a case where the RF coil 300 is divided into a plurality of RF coil units (the first RF coil unit 301, the second RF coil unit 302, and the third RF coil unit 303) by dividing portions of the housings (positions shown with 312 and 323) as described above, and those are placed on the table top 401. The respective RF coil units are installed such that end portions overlap each other as shown as overlapped portions 312 and 323.

The reason why the end portions are arranged to overlap each other is described here. When the distance between two coil elements is relatively large, electromagnetic coupling between the two coil elements can be reduced to a level of practically no problem. However, in a case where the loop dimension of the coil element is large relative to the distance between the two coil elements, magnetic coupling between the coil elements can be removed by appropriately overlapping the adjacent two coil elements (in about 10% of the area).

As shown in FIG. 3, by overlapping the end portions of the adjacent coil units, the coil elements in the adjacent coil units can always overlap each other in the constant area, so that magnetic coupling between the coil elements can be removed.

The third RF coil unit 303 is placed at an approximately center portion (i.e., in a portion close to the waist of a subject) in the longitudinal direction of the table top 401, the second RF coil unit 302 is placed next to the third RF coil unit 303, and the first RF coil unit 301 is placed next to the second RF coil unit 302. While the adjacent RF coil units are arranged to overlap each other in the end portions thereof, the overlapped portions 323 and 312 are formed so that the end portion of the RF coil unit closer to the center portion is arranged on the lower side.

Thus, the first RF coil unit 301 (RF coil for the head portion), that is the most frequently attached and detached, is formed such that it is always arranged on the upper side in the overlapped portion. The second RF coil unit 302, that is attached and detached relatively less frequently, is formed such that the end portion is arranged on the lower side in the overlapped portion 312 and is arranged on the upper side in the overlapped portion 323.

The RF coil unit 303 (RF coil arranged at a position around the waist portion of a subject and used for imaging from the abdomen to the thighs) is arranged at the most closest position to the center portion of the table top 401, and is formed such that the end portion thereof is always on the lower side as in the overlapped portion 323. The third RF coil unit 303 is an RF coil unit for a portion around the waist, and the position of the third RF coil unit 303 is considered to be almost the same both in a case of Head-First mode and a case of Feet-First mode. Therefore, the third RF coil unit 303 is characteristic that it is the least frequently attached and detached. Moreover, the RF coil unit 303 may be fixed and connected to the table top in some cases, instead of being attachable/detachable. In addition, the third RF coil unit 303 is formed such that the end portion thereof which is to overlap the fourth RF coil unit 304 shown in FIG. 2 or the second RF coil unit 302 in Feet-First mode (i.e., the farther end portion from the gantry) is also arranged on the lower side. Furthermore, the respective RF coil units are arranged with no electric connection therebetween.

As described above, since the RF coil unit 301 for the head portion is considered to be the most frequently attached and detached, the shape of the stepped portion of the dividing portion of the RF coil unit for the head portion has a projection on the farther side from the table top so that the overlapping portion of the RF coil unit for the head portion is arranged at the uppermost level. On the other hand, in the RF coil for the portion around the waist, the shape of the stepped portion in the dividing portion projects on the closer side to the table top so that the overlapping portion of that RF coil unit is located at the bottom. The shape of the dividing portion may be stepped as shown in FIG. 3 or inclined. In a case where it is stepped, the coil unit can be stably fixed. Also, by modifying the projection of the stepped portion as described above, the coil unit which is more frequently attached and detached can be arranged at an upper level, thereby allowing easy attachment and detachment.

Figure 4:
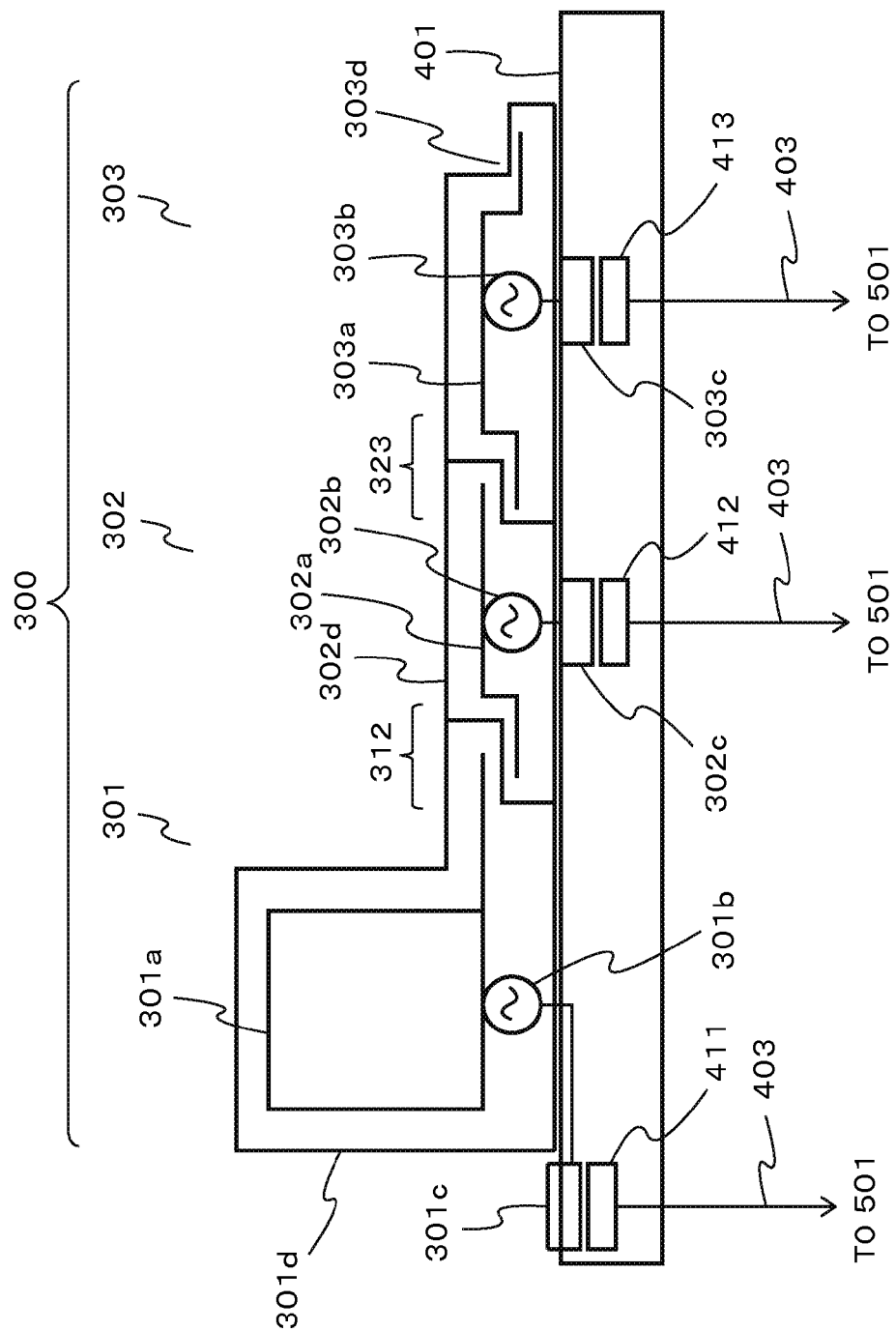
FIG. 4 is a view showing the inside of the portable table, the RF coil units installed thereon, and the table top in the first example of the present invention.

FIG. 4 shows an internal structure of FIG. 3. The first RF coil unit 301, the second RF coil unit 302, and the third RF coil unit 303 have a first coil element 301a, a second coil element 302a, a third coil element 303a; a first feed point 301b, a second feed point 302b, and a third feed point 303b; and a first coil connector 301c, a second coil connector 302c, and a third coil connector 303c in housings 301d, 302d, and 303d, respectively, which are connected in a high-frequency manner.

The coil elements in the adjacent units (301a and 302a, and 302a and 303a in FIG. 4) overlap each other at least partly. The respective housings 301d to 303d are boxes each accommodating the coil element (301a to 303a) and the feed point (301b to 303b) and separate the RF coil at respective dividing portions (312 and 323), as shown in the drawing. The housing dividing portions (312 and 323) are provided between the coil elements of the adjacent units, that is, are provided so as not to cut the coil elements and so as to avoid the coil elements. The feed point is a circuit which is connected to each coil element to detect a high frequency signal received by that coil element. Moreover, the dividing portion is a portion of the housing which overlaps the housing of the adjacent unit. By the dividing portions, the RF coil 300 is divided into a plurality of units.

The table top 401 includes a first table top connector 411, a second table top connector 412, and a third table top connector 413. The respective table top connectors are connected to the docking connector 501 via the cable wiring 403. When the respective divided RF coil units are installed on the table top, the coil connector 303c is connected to the table top connector 413, the coil connector 302c is connected to the table top connector 412, and the coil connector 301c is connected to the table top connector 411.

For example, in a case where the RF coil 300 is a reception coil, a magnetic resonance signal is received by the coil elements 301a, 302a, and 303a and is detected by the feed points 301b, 302b, and 303b. The detected signals are transmitted to the docking connector 501 through the respective coil connectors 301c, 302c, and 303c and the table top connectors 411, 412, and 413, and further through the cable wiring 403. In FIG. 4, in the overlapped portions 312 and 323, the coil elements 301a and 302a spatially overlap each other and the coil elements 302a and 303a spatially overlap each other. The respective RF coil units are arranged to overlap each other by the optimum amount for minimizing magnetic coupling between the adjacent coil elements, and a mechanism for electrically connecting the respective RF coil units (connection portion) is not required. Further, the coil elements 302a, 303a are folded back such that the physical distance between a subject (not shown) on the RF coil unit 300 and each coil element is as close as possible in a portion other than the overlapped portion, thereby a high-sensitivity RF coil is realized.

Each coil element 301a to 303a includes one or more coil elements 300 shown in FIG. 13. In a case where there are a plurality of coil elements 300 in one coil element (301a, for example), the respective coil elements 300 overlap each other to form the coil element 301a. A state where the respective coil elements 300 overlap each other is described. The coil elements 300 are arranged to be laid along the inside of the housing of the unit, and one of the coil elements 300 is raised only at an intersection of the coil elements 300. Inside the overlapped portion, in a portion other than the intersection of the coils, each coil element 300 is arranged to be laid along the inside of the housing.

On the other hand, in a case where portions of the coil elements of different units overlap each other, the coil elements overlap via the housing. Therefore, in the portion where the coil elements overlap (portions 312 and 323 in FIG. 4), inside portions where two coils overlap each other, other than the intersection, overlap each other with a width in a vertical direction (thickness direction), as shown in FIG. 4. Since the coil elements 301a and 302a are installed by being laid along the inside of the housings thereof, respectively, two coils are arranged away from each other in the vertical direction by at least two times the thickness of the material (e.g., plastic) forming the housing. In a case where the housing is made of plastic material having a width of about 1 cm, the two coils are away from each other by about 2 to 3 cm. In a case where the material is thicker, the two coils may be away from each other by 2 cm or more.

Next, two embodiments of the present invention are described, using FIGS. 5 and 6. In FIG. 5, a plurality of RF coils (units 302 to 304) are provided in addition to a head-portion RF coil (unit 301). In FIG. 6, other than the head-portion RF coil (unit 301), one RF coil (unit 305) is provided. In the embodiment of FIG. 5, the RF coil is divided into at least three units (four units in FIG. 5), the position of the center unit (303 in FIG. 5, the center unit is located around the waist of the subject) is fixed, and the positions of both the adjacent units can be exchanged.

In FIG. 6, other than the head-portion unit 301, one unit 305 is provided. The unit 301 can be arranged on both sides of the unit 305 while the unit 305 is fixed. In other words, imaging in Head-First mode and imaging in Feet-First mode can be easily realized. More specifically, the first RF coil unit 301 and the fifth RF coil unit 305 are installed on the table top 401. The first RF coil unit is an exclusive RF coil generally having the sensitivity range from the head portion to the cervical vertebra of a subject (not shown), while the fifth RF coil unit 305 is a general-purpose RF coil having the sensitivity range from under the neck to the toe of the subject (not shown). For performing both Head-First imaging and Feet-First imaging with this configuration, the first RF coil unit 301 is moved to the other side of the fifth RF coil unit 305 on the table top 401.

On the other hand, FIG. 5 is a diagram of a plurality of RF coil units into which a permanent RF coil is divided and which can be attached/detached, where the third RF coil unit 303 is arranged around the center portion of the table top 401, the second RF coil unit 302 and the fourth RF coil unit 304 are arranged on both sides of the third RF coil unit 303, and the first RF coil unit 301 is arranged next to the second RF coil unit 302. End portions of the adjacent RF coil units overlap each other so that the end portion of the RF coil unit closer to the center portion of the table top 401 is located on the lower side. As described above, by dividing the RF coil into a number of RF coil units and arranging the RF coil units so that one of them is located at the center of them on the center portion of the table top 401 and the other RF coil units are arranged on the table top in appropriate sizes, the portable table and the RF coil system can be realized which correspond to both Head-First imaging and Feet-First imaging.

As compared with the arrangement of FIG. 6, the arrangement of FIG. 5 can reduce the entire length of the table top 401 while the same sensitivity range is kept, and therefore can reduce the installation space of the device.

Example 2

A second example of the present invention is described below, referring to FIG. 1 and FIG. 7. In this example, an example of division and installation of RF coil units is described which enables the RF coil units to be arranged not only in the longitudinal direction of the table top 401 but also in the lateral direction (body width direction).

Figure 7:
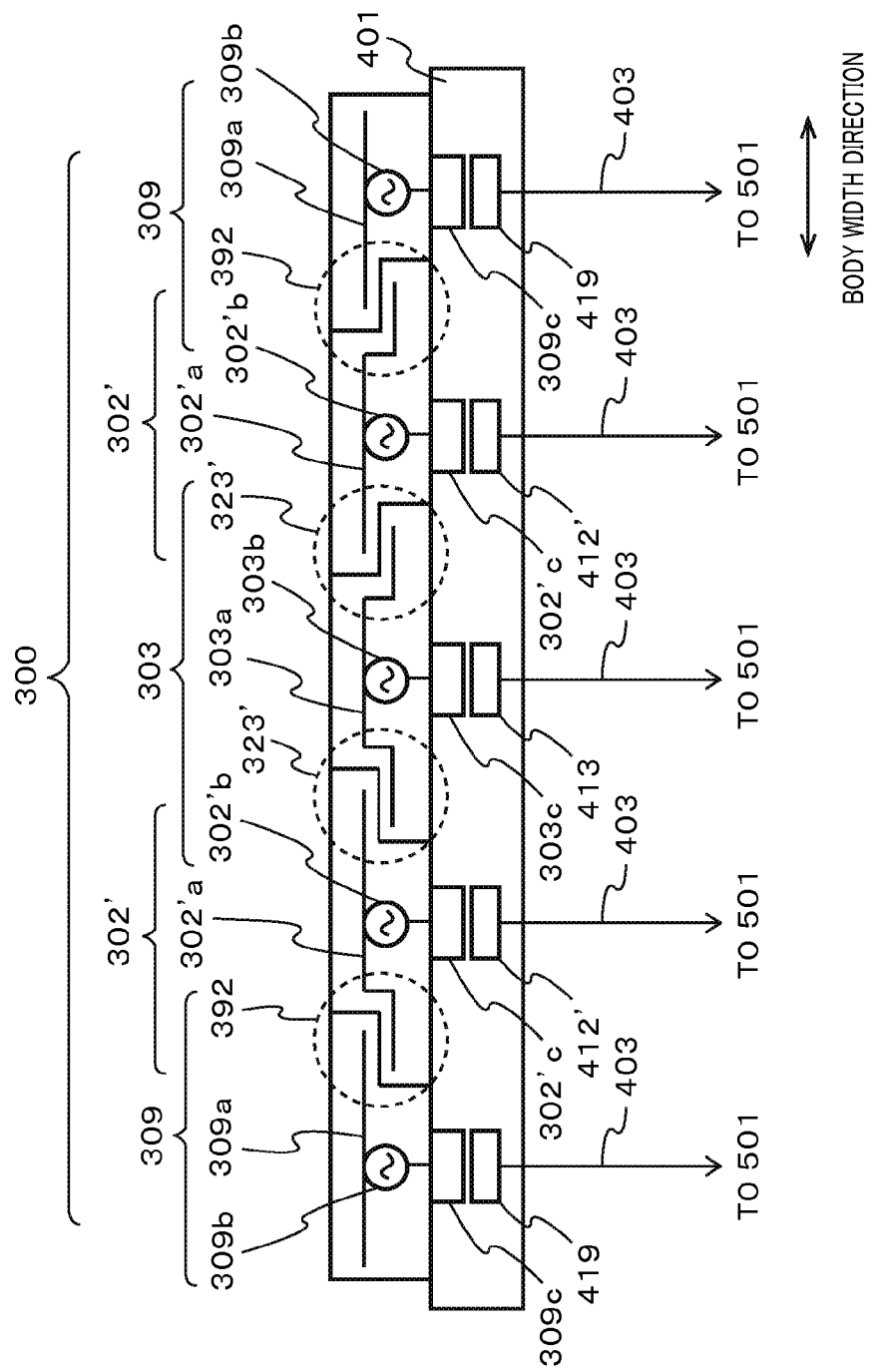
FIG. 7 shows a second example of the present invention, and shows the inside of a portable table, RF coil units installed on a table top of the portable table, and the table top.

FIG. 7 is a structure diagram showing a third RF coil unit 303, a second RF coil unit 302', and a sixth RF coil unit 309 in the lateral direction (body width direction) of a table top 401 of a portable table in an MRI device having the portable table 400 which can be attached to and detached from a gantry 100, and shows an exemplary internal structure. In the RF coil unit 300 of the MRI device of FIG. 1, FIG. 4 shows an example in which division of the RF coil unit is made in the body axis direction. This example is different from that example in that division is made in the lateral (body width) direction of the table top.

For portions having the same functions as the structures labeled with the same reference signs in FIG. 1 which have been already described, the description is omitted. Moreover, because the second RF coil unit 302' has the same shape as the aforementioned second RF coil unit 302 but is different in the orientation, the same reference numeral is assigned and "'" is additionally assigned.

In FIG. 7, an example is shown in which end portions of adjacent RF coil units in the lateral (body width) direction of the table top 401 overlap each other as in portions 323' and 392 circled with broken line. The end portion of the third RF coil unit 303 which is closer to the center portion of the table top 401 is arranged on the lower side and the end portion of the second RF coil unit 302' which is farther from the center portion of the table top 401 in the body width direction is arranged on the upper side, so that the overlapped portion 323' is formed. Moreover, in a case where the sixth RF coil unit 309 is arranged to be farther away from the center portion of the table top 401 in the body width direction, the overlapped portion 392 is formed in such a manner that the end portion of the second RF coil unit 302' which is closer to the center portion of the table top is arranged on the lower side and the end portion of the sixth RF coil unit 309 is arranged on the upper side.

Inside the RF coil unit, the third RF coil unit 303, the second RF coil unit 302', and the sixth RF coil unit 309 include the third coil element 303a, the second coil element 302'a, and the sixth coil element 309a; the third feed point 303b, the second feed point 302'b, and the sixth feed point 309b; and the third coil connector 303c, the second coil connector 302'c, and the sixth coil connector 309c, respectively, which are connected in a high-frequency manner.

The table top 401 includes a fourth table top connector 412' and a fifth table top connector 419, in addition to the aforementioned third table top connector 419. The respective table top connectors are connected to the docking connector 501 via the cable wiring 403. When the respective divided RF coil units are installed on the table top, the third coil connector 303c is connected to the third table top connector 413, the second coil connector 302'c is connected to the fourth table top connector 412', and the sixth coil connector 309c is connected to the fifth table top connector 419.

Similarly to Example 1, in a case where the RF coil 300 is a reception coil, the coil elements 303a, 302'a, and 309a receive a magnetic resonance signal. The magnetic resonance signal is detected by the feed points 303b, 302'b, and 309b. The detected signals are transmitted to the docking connector 501 through the coil connectors 303c, 302'c, and 309c and the table top connectors 413, 412', and 419, and further through the cable wiring 403. In FIG. 7, in the overlapped portions 323' and 392, the coil elements 303a and 302'a spatially overlap each other and the coil elements 302'a and 309a spatially overlap each other. In this example, the respective RF coil units are designed to overlap each other by the optimum amount for minimizing magnetic coupling between the adjacent coil elements, and a mechanism for electrically connecting the respective RF coil units (connection portion) is not required. Moreover, the coil elements 302'a, 303a are folded back such that the physical distance between the subject (not shown) on the RF coil 300 and each coil element is as close as possible in a portion other than the overlapped portion, thereby a highly sensitive RF coil is realized.

Example 3

A third example of the present invention is described below, referring to FIGS. 1, 8, 9, and 10. In this example, an example of installation in which the divided RF coil units are arranged in a matrix on the table top 401, an exemplary arrangement of table top connectors provided in the table top 401, and an identification structure for installing the respective coil units at correct installation positions are described.

Example 1 is characteristic in that the adjacent RF coil units in the body axis direction overlap each other such that the end portion of the RF coil unit closer to the center portion of the table top 401 is arranged on the lower side and the end portion of the RF coil unit farther from the center portion of the table top 401 is arranged on the upper side, and Example 2 is characteristic in that the RF coil units adjacent in the body width direction overlap each other in the same manner as that in Example 1. This example shown in the upper diagram of FIG. 8 is an example in which the arranging direction of the RF coil units is expanded in both the body axis direction (302-303-302) and the body width direction (302'-303-302'), and a diagram is shown in which seventh RF coil units 310 are arranged on the outside of the RF coil units 302 and 302' in the body width direction of the table top.

Moreover, the lower diagram in FIG. 8 shows an example in which an eighth RF coil unit 311 having a further different shape is arranged on the outside of the RF coil unit 310 in the body width direction. As shown in the lower diagram of FIG. 8, also in the body axis direction, the RF coil unit 301 or 304 can be arranged further outside.

Figure 9:
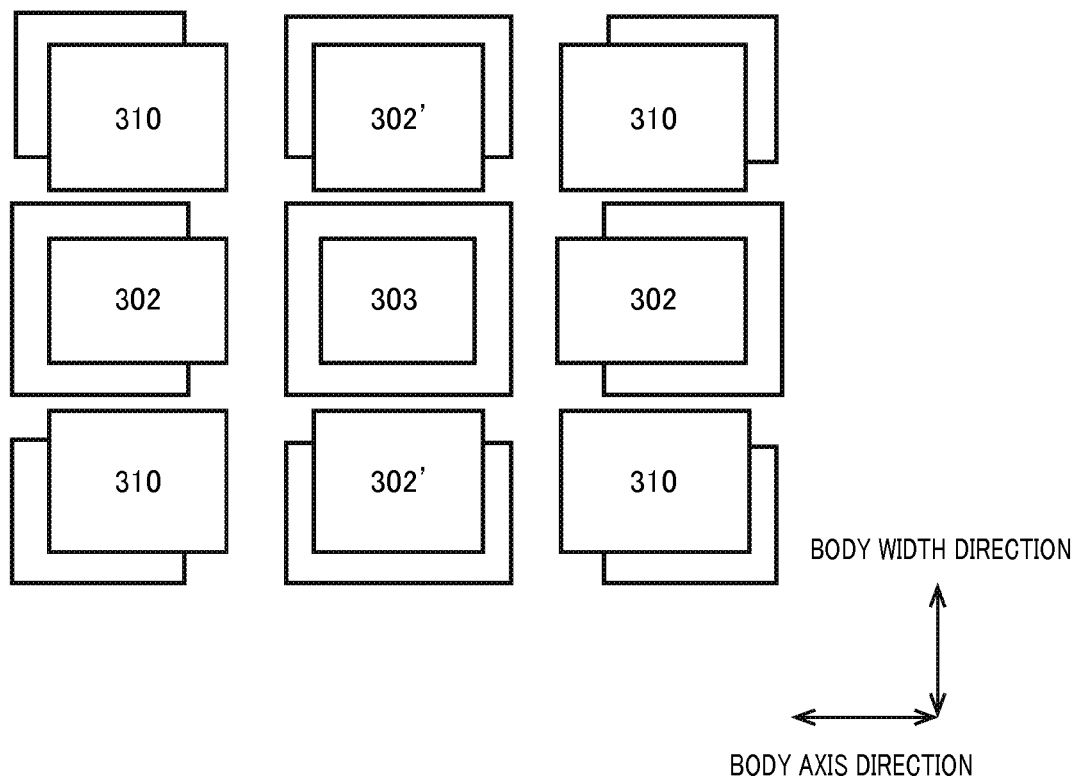
FIG. 9 is a diagram showing an example of division of the RF coil units in the third example of the present invention.

FIG. 9 shows the unit shape when the respective RF coil units in the arrangement are divided. In any exemplary arrangement, the RF coil unit 303 which is the closest to the center portion of the table top 401 is arranged at the center, the end portions of the adjacent RF coil units overlap each other, the end portion of the RF coil unit closer to the center portion of the table top 401 is arranged on the lower side, the end portion of the RF coil unit farther from the center portion of the table top 401 is arranged on the upper side, and the RF coil units are arranged in a two-dimensional matrix with no electrical connection therebetween.

FIG. 10 shows a cross-section of the table top 401, the RF coil unit 300 arranged thereon, and the divided (first to third) RF coil units 301, 302, and 303, when seen from the side. In a case where the RF coil units are arranged two-dimensionally as in this example, it is likely that the table top connectors and the coil connectors are wrongly connected to each other, respectively, if connection relies only on matching of the overlapping shapes of the end portions of the respective RF coil units. Therefore, concave/convex portions 362c, 363c, 462c, and 463c for preventing that are shown. The concave/convex portion 462c or 463c is formed in the installation surface of the table top very close to the table top connector, and the convex/concave portion 362c or 363c is formed in the installation surface of the bottom surface of each RF coil unit very close to the coil connector. Connection of the table top connector and the coil connector to each other can be established only when the concave/convex shapes match each other. In place of the concave/convex portions, marks such as colors, figures, or numerals may be applied on each RF coil unit to be connected and the table top at positions very close to the coil connector and the table top connector, so that correct combination can be determined without electrical connection.

The concave/convex portions for preventing wrong connection between the table top connectors and the coil connectors of the respective units or the marks such as colors, figures, or numerals can be applied to the embodiments described in Examples 1, 2, and 4.

When the portable table is connected to the gantry, an identification command may be issued from the table control portion 200 to data in a coil ID memory provided in the coil connector of each RF coil unit to make an access and, if the ID is not coincident, a user may be notified that the coil units are wrongly arranged.

Moreover, when there is a unit which is not connected, that may be recognized and a user may be notified of that. Such a user notification of wrong connection or the like can be also applied to the embodiments of Examples 1, 2, and 4 in the same manner.

Figure 11:
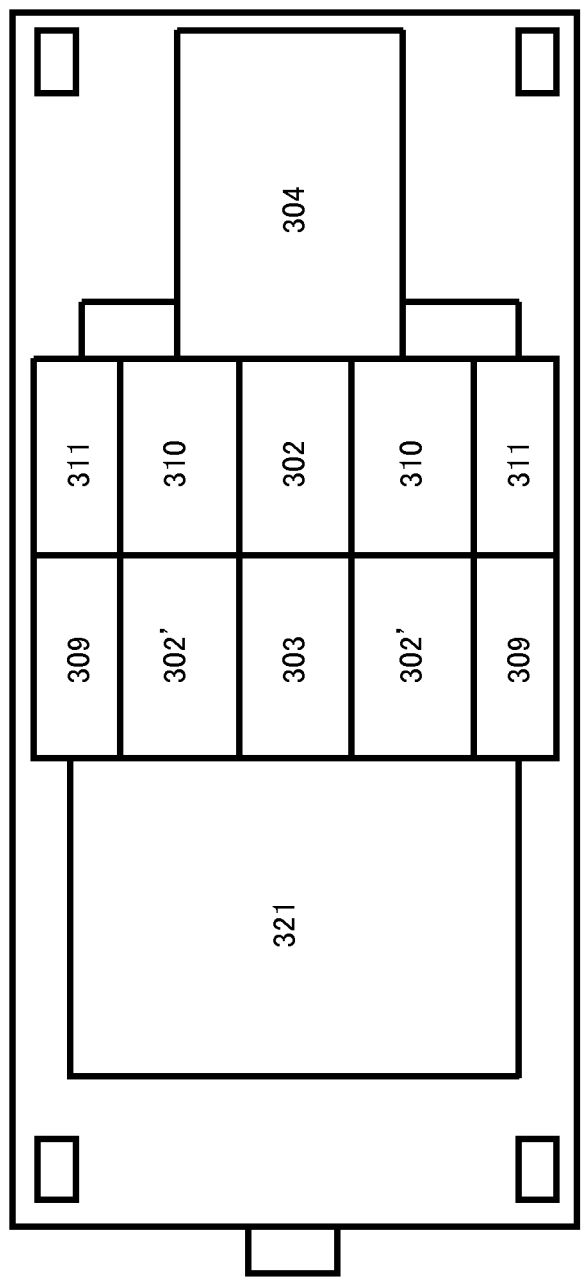
FIG. 11 shows a fourth example of the present invention, and is a diagram showing that a portion of RF coil units arranged in a matrix has been detached and instead an RF coil exclusive for a region is installed in that space.
Figure 12:
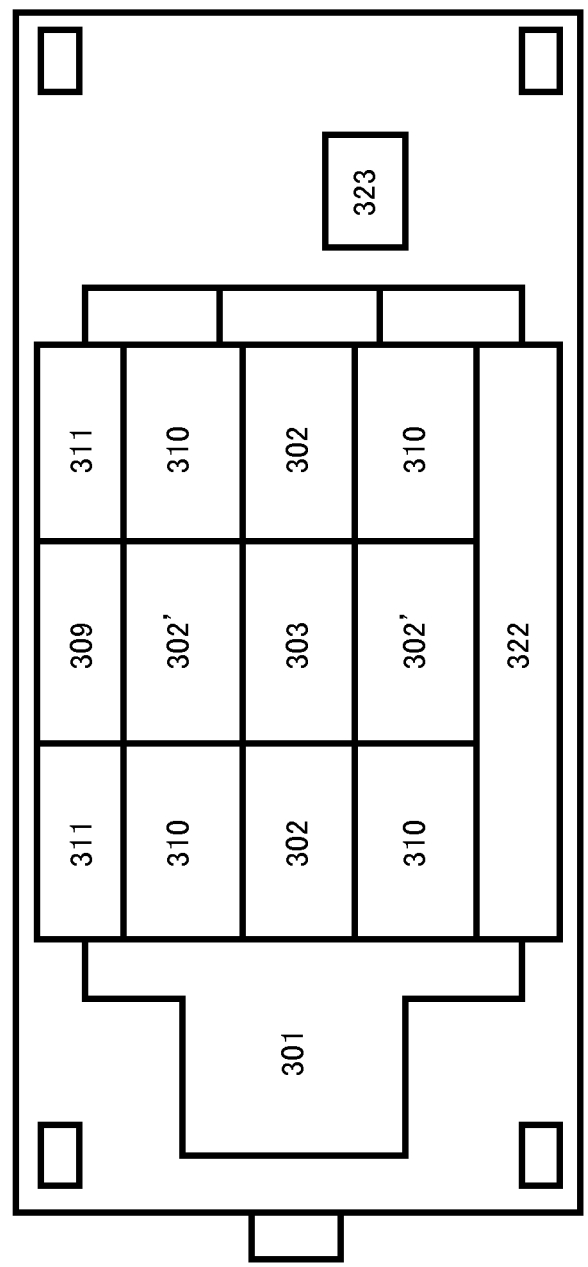
FIG. 12 shows the fourth example of the present invention, and is a diagram showing that a portion of the RF coil units arranged in a matrix has been detached and instead an RF coil exclusive for a local region is installed in that space.

As a method for notifying a user of wrong connection or the like, FIG. 11, FIG. 12 or the like may be displayed on the display device 109 so that a wrongly connected portion or a portion not connected is displayed in a different color as warning. Also in the embodiments of Examples 1, 2, and 4, the wrongly connected unit or the unit not connected is displayed in a different color together with a diagram showing how the coil units are divided as in FIG. 11 or 12.

Example 4

A fourth example of the present invention is described, referring to FIGS. 11 and 12. In this example, an example of division and installation of the RF coil units arranged in a matrix on the table top 401 and an example of effectively using the space on the table top 401 are described. In the structure in which the permanent RF coil 300 installed on the table top can be partly attached and detached, in a space for the RF coil unit which has been partly detached, another region exclusive RF coil can be installed instead. For example, FIG. 11 shows an example in which the first RF coil unit 301, the second RF coil unit 302, the seventh RF coil units 310, and the eighth RF coil units 311 have been removed from the state of the lower diagram of FIG. 8 and instead a first region exclusive RF coil unit 321 is installed. For example, when an RF coil exclusive for mammography is used as the RF coil unit 321 as in a case of mammo MRI, a higher quality image can be obtained than in a case of using the permanent RF coil installed on the table top. FIG. 12 shows an example in which the fourth RF coil unit 304, the sixth RF coil unit 309, and the eighth RF coil units 311 have been removed from the state of the lower diagram of FIG. 8 and instead a second region exclusive RF coil unit 322 and a third region exclusive RF coil unit 323 are installed. For example, when an RF coil for upper arm imaging is installed as the RF coil unit 322 or an RF coil for knee imaging is installed as the RF coil unit 323, a desired region of interest can be imaged by means of a local RF coil with higher sensitivity. Although the above examples describe cases of mammo MRI, upper arm imaging, and knee imaging, the present invention is not limited thereto. According to the present invention, a part unit of the permanent RF coil units co-existing can be always arranged closer to the center portion of the table top than the region exclusive RF coil, and, in a case where the end portions of the RF coil units are overlapped to reduce electromagnetic coupling, the permanent RF coil unit can be arranged on the lower side. Therefore, it is enough that only the minimum required RF coil unit is removed. Furthermore, when electromagnetic coupling is reduced by control of the trap circuit 300c in the RF coil by the table control portion 200 shown in FIG. 13 in accordance with a pulse sequence, the permanent RF coil which can be partly attached and detached and the region exclusive RF coil can be simultaneously used in combination on a relatively small table top.

REFERENCE SIGNS LIST

100 Gantry
101 Magnet
102 Gradient magnet field generation coil
103 High frequency transmitter coil
104 Subject
105 Receiver
105a A/D signal processor
106 High frequency magnetic field generator
107 Gradient magnetic field power source
108 Storage medium
109 Display device
110 Sequencer
111 Calculation portion
200 Table top control portion
200a Current supply source
200b Preamplifier driving power source
300 RF coil
300a Coil element
300b Signal detection portion
300c Coil connector
300d Reception cable
300e Trap circuit
301 to 311 RF coil unit
301 First RF coil unit
301a First coil element
301b First feed point
301c First coil connector
302 Second RF coil unit
302' Second RF coil unit
302a Second coil element
302'a Second coil element
302b Second feed point
302'b Second feed point
302c Second coil connector
302'c Second coil connector
303 Third RF coil unit
303a Third coil element
303b Third feed point
303c Third coil connector
304 Fourth RF coil unit
305 Fifth RF coil unit
309 Sixth RF coil unit
309a Sixth coil element
309b Sixth feed point
309c Sixth coil connector
310 Seventh RF coil unit
311 Eighth RF coil unit
321 First region exclusive RF coil unit
322 Second region exclusive RF coil unit
323 Third region exclusive RF coil unit
312, 323, 323', 392 Overlapped portion
362c, 363c, 462c, 463c Concave/convex portion
400 Portable table
401 Table top
402 Frame
403 Composite cable wiring
410 Table top connector
411 First table top connector
412 Second table top connector
413 Third table top connector
412' Fourth table top connector
419 Fifth table top connector
501, 502 Docking connector
701 Preamplifier
702 Power supply cable
703 Capacitor
704 Inductor
705 Diode
706 Current supply cable

The invention claimed is:
1. A magnetic resonance imaging device comprising:
a static magnetic field application portion adapted to apply a static magnetic field;
a gradient magnetic field application portion adapted to apply a gradient magnetic field to a subject placed in the static magnetic field;
a high frequency magnetic field irradiation portion adapted to irradiate the subject, to which the static magnetic field and the gradient magnetic field are applied, with a high frequency magnetic field;
an RF coil adapted to receive a nuclear magnetic resonance signal generated by the subject; and
a table top, connected to the RF coil, adapted to allow the RF coil to be placed on the table top,
wherein the RF coil includes:
a plurality of coil elements adapted to receive the nuclear magnetic resonance signal from the subject on different channels, respectively;
feed points connected to the coil elements to detect the nuclear magnetic resonance signal received by the coil elements, respectively; and
a plurality of housings adapted to accommodate the coil elements and the feed points, respectively, wherein the RF coil is divided into a plurality of units each including the coil element, the feed point, and the housing by dividing portions of the housings, each of which has a stepped shape, the plurality of units are connected to specific portions of the table top, respectively, and the unit having the stepped shape which projects on a farther side from the table top, and the unit having the stepped shape which projects on a closer side to the table top overlap each other at the dividing portion on the table top, and wherein the unit having the stepped shape which projects on the closer side is connected closer to a center portion of the table top, and the unit having the stepped shape which projects on the farther side is connected farther away from the center portion.

2. The magnetic resonance imaging device according to claim 1, wherein the dividing portion is provided between coil elements of adjacent units, so that the coil elements of the adjacent units overlap each other at least partly.

3. The magnetic resonance imaging device according to claim 1, wherein the unit having the stepped shape which projects on the farther side, and the unit having the stepped shape which projects on the closer side are arranged in a longitudinal direction of the table top.

4. The magnetic resonance imaging device according to claim 1, wherein the unit having the stepped shape which projects on the farther side, and the unit having the stepped shape which projects on the closer side are arranged in a short axial direction of the table top.

5. The magnetic resonance imaging device according to claim 1, wherein the unit connected farther away from the center portion is used for a head portion of the subject, and the unit connected closer to the center portion is used for a portion around a waist of the subject.

6. The magnetic resonance imaging device according to claim 1, wherein the plurality of units include a head-portion unit used for the head portion of the subject, and another unit, and the head-portion unit is installable on both sides of another unit.

7. The magnetic resonance imaging device according to claim 1, wherein the RF coil is divided into at least a first, a second, and a third units, the second unit is a unit connected most closest to the center portion, and having the stepped shape which projects on the closer side, the first and third unit are units farther away from the center portion, and having he stepped shape which projects on the farther side, and while the second unit is fixed to the table top, positions of the first and third units are exchangeable.

* * * * *